US006963246B2

(12) United States Patent
Sugimura (10) Patent No.: US 6,963,246 B2
(45) Date of Patent: Nov. 8, 2005

(54) WIDEBAND AMPLIFIER (75) Inventor: Naoaki Sugimura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 5 days.

(21) Appl. No.: 10/731,032

(22) Filed: Dec. 10, 2003

(65) Prior Publication Data

US 2004/0263251 A1 Dec. 30, 2004

(30) Foreign Application Priority Data

Jun. 25, 2003 (JP) ........................... 2003-181094

(51) Int. Cl.[7] ................................. H03F 3/45
(52) U.S. Cl. ........................ 330/260; 330/292
(58) Field of Search ..................... 330/253, 260, 330/292, 302, 310

(56) References Cited

U.S. PATENT DOCUMENTS 5,652,545 A * 7/1997 Miyashita et al. .......... 330/269

FOREIGN PATENT DOCUMENTS

| JP | 07-79123 | 3/1995 |
| JP | 08-116223 | 5/1996 |
| JP | 2003-69352 | 3/2003 |

OTHER PUBLICATIONS

2001 IEEE International Solid–State Circuits Conference, pp. 130–131, Young–In park et al. et al. (English).
2001 IEEE International Solid–State Circuits Conference, pp. 134–135, Dan Kelly et al. (English).
"Analog Integrated Circuit", pp. 262–264, Alen B. Grebene (English translation and its original in Japanese).

* cited by examiner

Primary Examiner—Steven J. Mottola
(74) Attorney, Agent, or Firm—Nixon Peabody LLP; Donald R. Studebaker

(57) ABSTRACT

Provided is a wideband amplifier which can provide an increased operation bandwidth without being limited by manufacturing process. A source follower circuit having a MOS transistor and constant-current supplies is provided in parallel to a MOS transistor serving as an amplifier of the input stage. Furthermore, the sources of the MOS transistor serving as the output of the source follower circuit are connected to the output nodes of the input stage amplifier via phase compensation capacitors, respectively. This configuration provides an increased phase allowance to the wideband amplifier, thereby providing an improved operation bandwidth without being limited by the manufacturing process employed.

6 Claims, 6 Drawing Sheets

WIDEBAND AMPLIFIER

BACKGROUND OF THE INVENTION

1. Field of the Invention

The present invention relates to a wideband amplifier for use in a switched capacitor circuit in the field of an analog integrated circuit technology.

2. Description of the Related Art

Figure 1A:
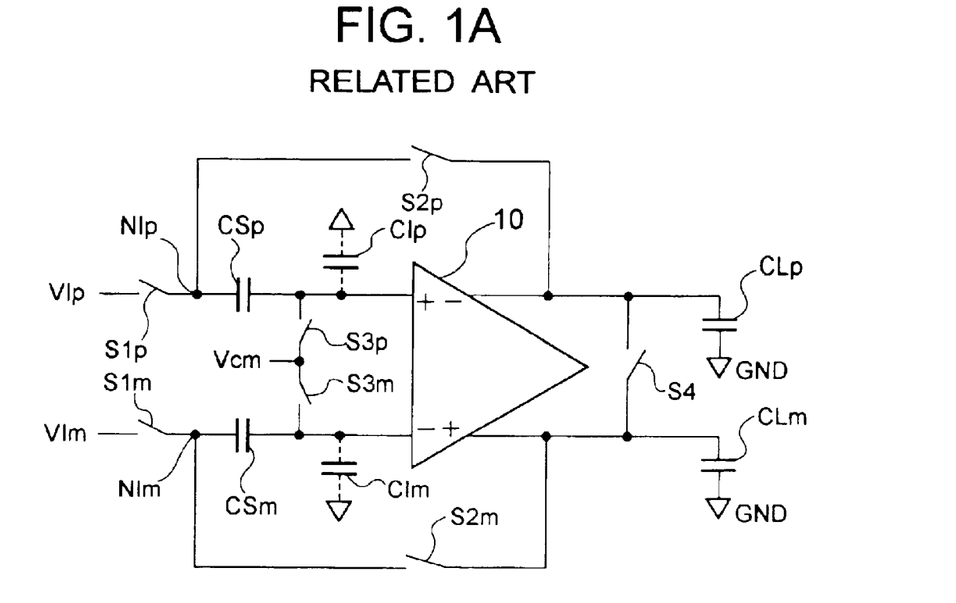
FIG. 1A is a circuit diagram illustrating a sample and hold circuit.
Figure 1B:
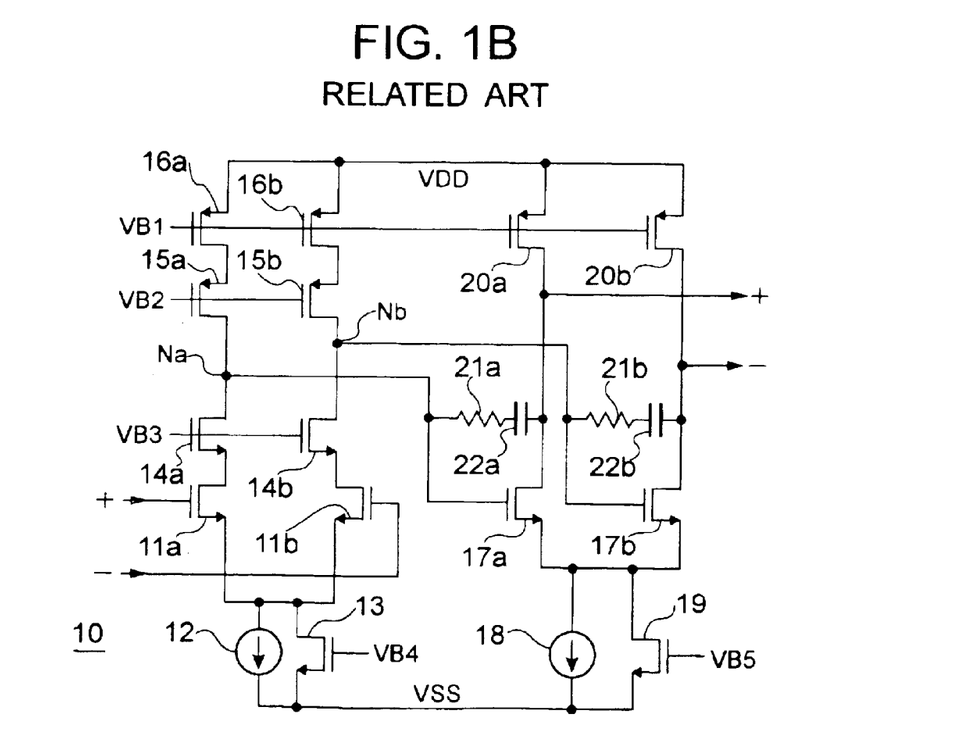
FIG. 1B is a circuit diagram illustrating an operational amplifier.

FIG. 1A is a circuit diagram showing a sample and hold circuit of such a pipeline ADC (Analog to Digital Converter) as described in a literature by Yong-In Park, S. Karthikeyan, Frank Tsay and Eduardo Barlolome, entitled "A 10b 100Msample/s CMOS Pipelined ADC with 1.8V Power Supply," IEEE International Solid-State Circuits Conference, pp. 130–131, 2001. FIG. 1B is a circuit diagram showing an operational amplifier for use in this sample and hold circuit.

As shown in FIG. 1A, this sample and hold circuit, which has an architecture generally referred to as the "Flip Around SHA," is provided with nodes NIp and NIm to which differential input signals VIp and VIm are supplied via switches SIp and SIm, respectively. The nodes NIp and NIm are connected to the plus(+) input terminal and minus(−) input terminal of an operational amplifier 10 via capacitors CSp and CSm, respectively, as well as to the minus(−) output terminal and plus(+) output terminal of the operational amplifier 10 via switches S2p and S2m, respectively.

The operational amplifier 10 receives a reference voltage Vcm at the plus input terminal and the minus input terminal via switches S3p and S3m, respectively. On the other hand, the operational amplifier 10 is connected to a ground potential GND at the plus output terminal and the minus output terminal via load capacitors CLp and CLm, respectively, and short-circuited therebetween by a switch S4.

Between the plus and minus input terminals of the operational amplifier 10 and the ground potential GND, there are formed input capacitance Cip and Cim, which are not connected as actual components but have detrimental effects on the operation of the operational amplifier 10 at high frequencies.

On the other hand, as shown in FIG. 1B, the operational amplifier 10 is formed of a typical two-stage differential amplifier with an input stage and an output stage.

The input stage 10-1 has N-channel MOS transistors 11a and 11b to which a differential input signal is supplied (hereinafter the MOS transistor is simply referred to as "MOST" and the N-channel MOS transistor as "NMOST"). The gates of the NMOSTs 11a and 11b serve as the plus input terminal and the minus input terminal of the operational amplifier 10, respectively. The sources of the NMOSTs 11a and 11b define a common connection and are connected to a potential VSS via a constant-current supply 12 and an NMOST 13, which are connected in parallel to each other.

The drains of the NMOSTs 11a and 11b are connected to nodes Na and Nb via NMOSTs 14a and 14b, respectively. The node Na is connected to a potential VDD via P-channel MOS (hereinafter referred to as "PMOST") 15a and 16a, which are connected in series to each other, while the node Nb is connected to the potential VDD via PMOSTs 15b and 16b, which are connected in series to each other.

The output stage 10-2 includes NMOSTs 17a and 17b having the gates connected to the nodes Na and Nb, respectively. The sources of the NMOSTs 17a and 17b are commonly connected to the potential VSS via a constant-current supply 18 and an NMOST 19, which are connected in parallel to each other. The drains of the NMOSTs 17a and 17b are connected to the potential VDD via PMOSTs 20a and 20b, respectively.

The drains of the NMOSTs 17a and 17b serve as the plus output terminal and the minus output terminal of the operational amplifier 10, respectively. Between the drain of the NMOST 17a and the node Na, there are a zero correction resistor 21a and a Miller capacitor (a phase compensation capacitor) 22a connected in series to each other. Between the drain of the NMOST 17b and the node Nb, a similar resistor 21b and a Miller capacitor (a phase compensation capacitor) 22b are connected in series to each other.

The gates of PMOSTs 16a, 16b, 20a and 20b are connected to a bias potential VB1, the gates of the PMOSTs 15a and 15b to a bias potential VB2, and the gates of the NMOSTs 14a and 14b to a bias potential VB3. Furthermore, the gates of the NMOSTs 13 and 19 are connected to bias potentials VB4 and VB5, respectively.

Figure 2:
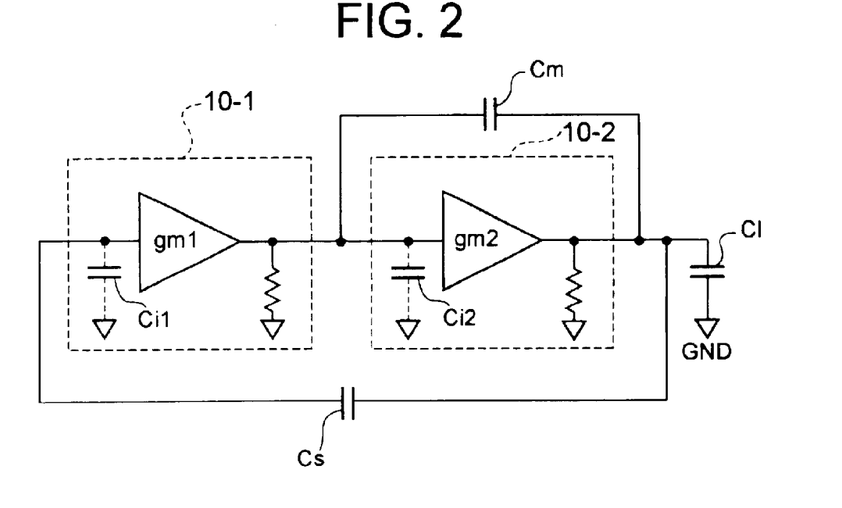
FIG. 2 is a view illustrating an equivalent circuit of the sample and hold circuit of FIG. 1A during its hold operation.

FIG. 2 is a view illustrating an equivalent circuit of the sample and hold circuit of FIG. 1A for a small high-frequency signal during a hold operation.

As shown in FIG. 2, during a hold operation, the input stage 10-1 and the output stage 10-2 of the operational amplifier 10 are connected in series, and the load capacitors CLp and CLm (with capacitance Cl) are connected between the output of the output stage 10-2 and the ground potential GND. The input and output of the output stage 10-2 are also connected to each other via the Miller capacitors 22a and 22b (with capacitance Cm). Additionally, the output of the output stage 10-2 and the input of the input stage 10-1 are connected to each other via the capacitors CSp and CSm (with capacitance Cs). Moreover, there is formed input capacitance Ci1 between the input of the input stage 10-1 and the ground potential GND, while input capacitance Ci2 is formed between the input of the output stage 10-2 and the ground potential GND.

In the above equivalent circuit, a closed-loop bandwidth BWcl indicative of an operation bandwidth is expressed as in the following equation (1):

$$BWcl = BWop \times \beta \qquad (1)$$

$$= \left\{ \frac{gm1}{Ci2 + Cm(1 + gm2)} \times \frac{gm2}{Cl + \frac{Cs \times Cil}{Cil + Cs}} \right\} \times \frac{Cs}{Cil + Cs},$$

where BWop is the bandwidth of the operational amplifier 10, β is the feedback factor, and gm1 and gm2 are the mutual conductance of the input stage 10-1 and the output stage 10-2, respectively.

In the above equation (1), since Cm(1+gm2)>>Ci2 and gm2>>1, the equation (1) can be approximately given by the following equation (2):

$$BWcl = \frac{gm1}{Cm} \times \frac{Cs}{Cil(Cl + Cs) + Cl \times Cs}. \qquad (2)$$

The mutual conductance gm1 and the input capacitance Ci1 of the input stage 10-1 can be expressed as in the following equations (3) and (4):

$$gm1 = \sqrt{2\mu \times Cox \times Id \times W/L}, \qquad (3)$$

$$Ci1 = Cox \times W \times L, \qquad (4)$$

where W is the gate width of the NMOSTs 11a and 11b, L is the gate length, $\mu$ is the electron mobility, Cox is the per-unit capacitance of the gate oxide film and Id is the drain current.

Substituting the equations (3) and (4) into the equation (2), the closed-loop bandwidth BWcl is expressed as in the following equation (5):

$$BWcl = \frac{Cs}{Cm} \times \frac{\sqrt{2\mu \times Cox \times Id \times W/L}}{Cox \times L \times W(Cl + Cs) + Cl \times Cs} \qquad (5)$$

$$= \frac{Cs}{Cm} \times \frac{\sqrt{2\mu \times Cox \times Id/L}}{Cox \times L \times \sqrt{W}(Cl + Cs) + \frac{Cl \times Cs}{\sqrt{W}}}.$$

The above equation (5) shows that the operation bandwidth of the sample and hold circuit employing a two-stage operational amplifier for performing phase compensation with Miller capacitance is determined by the dimensions of the gate length L and the gate width W of an input MOST at the input stage of the operational amplifier. Therefore, to maximize the operation bandwidth, the gate length L should be set at the minimum gate length Lmin or the lower limit available to the manufacturing process, while the gate width W should be set at an optimal dimension that can be obtained from the equation (5), i.e., the optimum gate width Wopt.

The optimum gate width Wopt takes the value as shown by the following equation (6), which is derived from the equation (5) by differentiating its denominator with respect to W to determine the value of W by which the result of the differentiation gives zero.

$$Wopt = \frac{Cl \times Cs}{Cox \times L(Cl + Cs)}. \qquad (6)$$

Using the minimum gate length Lmin and the optimum gate width Wopt, the maximum operation bandwidth BWmax of the sample and hold circuit shown in FIG. 1A is expressed as in the following equation (7):

$$BW\max = \frac{Cs}{Cm} \times \frac{\sqrt{2\mu \times Cox \times Id \times Wopt/L\min}}{Cox \times Wopt \times L\min(Cl + Cs) + Cl \times Cs}. \qquad (7)$$

However, the prior art operational amplifier has the following problems.

That is, as shown in the equation (7), the maximum operation bandwidth BWmax of the sample and hold circuit incorporating this operational amplifier is determined by the electron mobility $\mu$, the per-unit capacitance (of a gate oxide film) Cox, and the minimum gate length Lmin. However, since the manufacturing process employed determines these values, there has been a problem that the manufacturing process imposes limitations on the maximum operation bandwidth BWmax, which is also reduced by the value of the phase compensation capacitance Cm.

SUMMARY OF THE INVENTION

It is therefore an object of the present invention to provide a wideband amplifier which can offer an increased operation bandwidth without being limited by manufacturing process.

According to a first aspect of the present invention, provided is a wideband amplifier comprising a first amplifier for providing amplified differential signals obtained by amplifying differential first and second input signals to first and second nodes, respectively, and comprising a second amplifier for providing a differential output signal obtained by further amplifying the differential signals provided to the first and second nodes. The wideband amplifier comprises a first source follower circuit of a first MOS transistor having a gate provided with the first input signal and a source connected to a first constant-current supply as well as to the second node via a first phase compensation capacitor. The wideband amplifier further comprises a second source follower circuit of a second MOS transistor having a gate provided with the second input signal and a source connected to a second constant-current supply as well as to the first node via a second phase compensation capacitor.

According to a second aspect of the present invention, provided is a wideband amplifier which comprises a source follower circuit including a first MOS transistor and a second MOS transistor having respective gates provided with differential first and second input signals, respectively and respective sources connected to first and second constant-current supplies, respectively. The wideband amplifier further comprises a first amplifier for providing amplified differential signals obtained by amplifying respective source signals from the first MOS transistor and the second MOS transistor to first and second nodes, respectively. The wideband amplifier still further comprises a first phase compensation capacitor connected between the source of the first MOS transistor and the second node, a second phase compensation capacitor connected between the source of the second MOS transistor and the first node, and a second amplifier for providing a differential output signal obtained by further amplifying the differential signals provided to the first and second nodes.

The wideband amplifier according to the present invention is configured as described above. This configuration allows the phase compensation capacitor connected between the output of the source follower circuit and the output of the first amplifier to provide an increased phase allowance to the wideband amplifier. This makes it possible to increase the operation bandwidth without being limited by the manufacturing process employed.

DETAILED DESCRIPTION OF THE INVENTION

First Embodiment

Figure 3:
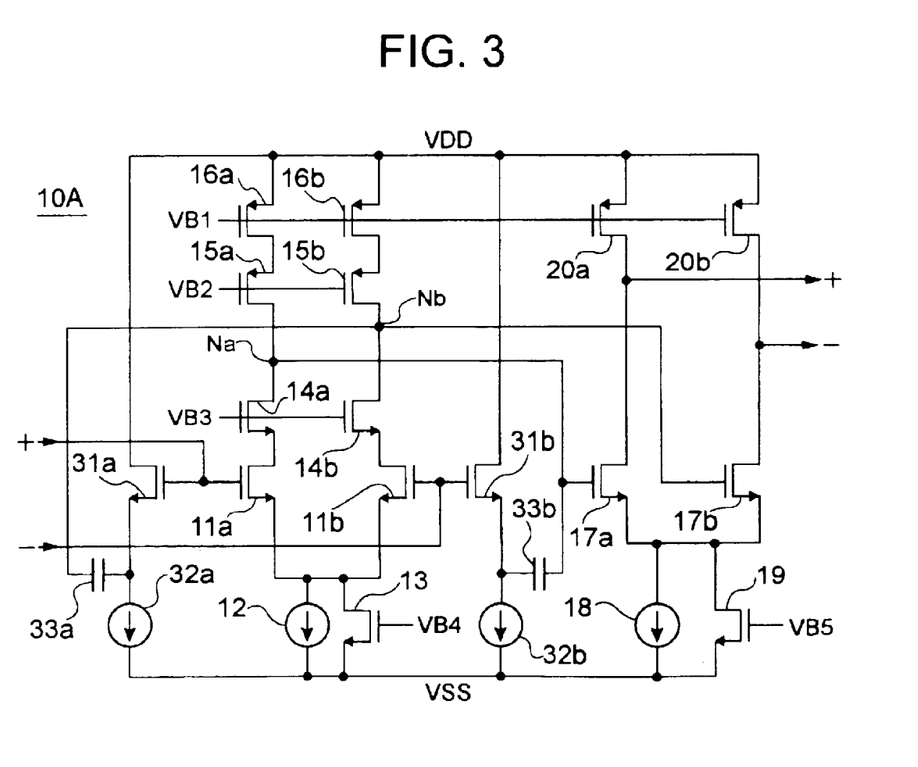
FIG. 3 is a view illustrating the architecture of a wideband amplifier according to a first embodiment of the present invention.

FIG. 3 is a view illustrating the architecture of a wideband amplifier according to a first embodiment of the present invention, in which the same components as those of FIG. 1B are indicated with the same reference symbols.

In addition to the same input stage 10-1 and output stage 10-2 as those of the conventional operational amplifier 10 shown in FIG. 1B, this wideband amplifier 10A is provided with an additional source follower circuit 10-3 in parallel to the input stage 10-1. Moreover, the Miller capacitor is eliminated which is conventionally connected between the input and output of the output stage 10-2. Instead of the Miller capacitor, there is a phase compensation capacitor interposed between the output of the source follower circuit 10-3 and the input of the output stage 10-2.

That is, the input stage 10-1 of the wideband amplifier 10A has the NMOSTs 11a and 11b to which a differential input signal is supplied, and the gates of the NMOSTs 11a and 11b serve as the plus(+) input terminal and the minus(−) input terminal of the wideband amplifier 10A, respectively. The sources of the NMOSTs 11a and 11b are commonly connected to the potential VSS via the constant-current supply 12 and the NMOST 13, which are connected in parallel to each other.

The drains of the NMOSTs 11a and 11b are connected to the nodes Na and Nb via the NMOSTs 14a and 14b, respectively. The node Na is connected to the potential VDD via the PMOSTs 15a and 16a, which are connected in series to each other, while the node Nb is connected to the potential VDD via the PMOSTs 15b and 16b, which are connected in series to each other.

The output stage 10-2 has the NMOSTs 17a and 17b, the gates of which are connected to the nodes Na and Nb, respectively. The sources of the NMOSTs 17a and 17b are commonly connected to the potential VSS via the constant-current supply 18 and the NMOST 19, which are connected in parallel to each other. The drains of the NMOSTs 17a and 17b are connected to the potential VDD via the PMOSTs 20a and 20b, and serve as the plus output terminal and the minus output terminal of the wideband amplifier 10A, respectively.

As the source follower circuit 10-3, the wideband amplifier 10A has also NMOSTs 31a and 31b, the gates of which are connected to the plus input terminal and the minus input terminal, respectively. The sources of the NMOSTs 31a and 31b are connected to the potential VSS via constant-current supplies 32a and 32b, respectively, and the drains are directly connected to the potential VDD. The source of the NMOST 31a is connected to the node Nb via a phase compensation capacitor 33a, while the source of the NMOST 31b connected to the node Na via a phase compensation capacitor 33b.

The gates of the PMOSTs 16a, 16b, 20a and 20b are connected to the bias potential VB1, the gates of the PMOSTs 15a and 15b to the bias potential VB2, and the gates of the NMOSTs 14a and 14b to the bias potential VB3, respectively. Furthermore, the gates of the NMOSTs 13 and 19 are connected to bias potentials VB4 and VB5, respectively.

Figure 4:
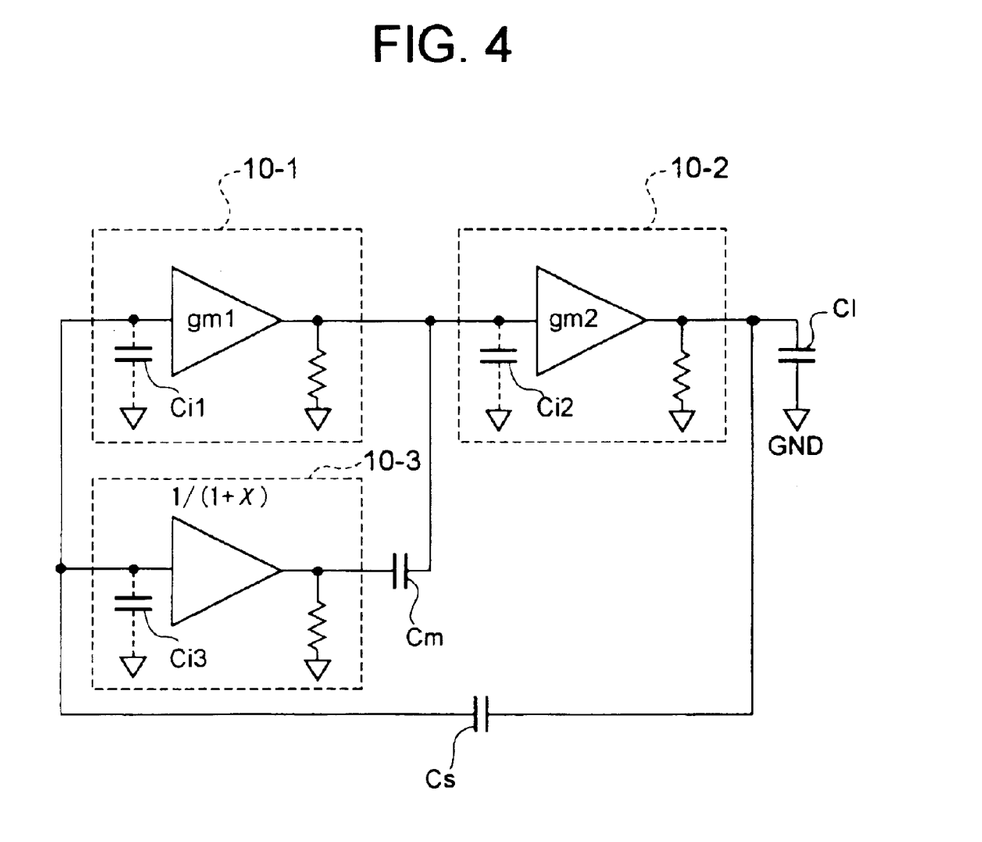
FIG. 4 is a view illustrating an equivalent circuit of the wideband amplifier of FIG. 3 during its hold operation.

FIG. 4 is a view illustrating an equivalent circuit of the wideband amplifier 10A of FIG. 3 serving as a sample and hold circuit, for a small high-frequency signal during its hold operation.

As shown in FIG. 4, during a hold operation, the input stage 10-1 and the output stage 10-2 of the wideband amplifier 10A are connected in series, and the load capacitors CLp and CLm (with capacitance Cl) are connected between the output of the output stage 10-2 and the ground potential GND. Additionally, the output of the output stage 10-2 and the input of the input stage 10-1 are connected to each other via the capacitors CSp and CSm (with capacitance Cs).

Furthermore, the source follower circuit 10-3 is connected in parallel to the input stage 10-1, and the output of the source follower circuit 10-3 is connected to the input of the output stage 10-2 via the phase compensation capacitors 33a and 33b (with capacitance Cm). Input capacitance Ci1 is formed between the ground potential GND and the input of the input stage 10-1, input capacitance Ci2 is formed between the ground potential GND and the output stage 10-2, and input capacitance Ci3 is formed between the ground potential GND and the source follower circuit 10-3.

In the above equivalent circuit, let BWop denote the bandwidth of the wideband amplifier 10A, and let $\beta$ denote the feedback factor. We assume that a small signal output resistor Ro1 of the input stage 10-1 is sufficiently higher than a small signal output resistor Ro3 of the source follower circuit 10-3, and that the first pole of the input stage 10-1 is lower than the zero point that is determined by the source follower circuit 10-3 and the parameters Cm, Ro1 and Ci2. Then, the closed-loop bandwidth BWcl indicative of an operation bandwidth is expressed as in the following equation (8):

$$BWcl = BWop \times \beta \quad (8)$$

$$= \left\{ \frac{1}{1+\chi} \times \frac{Cm}{Cm+Ci2} \times \frac{gm2}{Cl + \frac{Cs(Ci1+Ci3)}{Ci1+Ci3+Cs}} \right\} \times \frac{Cs}{Ci1+Ci3+Cs}$$

$$= \frac{1}{1+\chi} \times \frac{Cm}{Cm+Ci2} \times \frac{gm2 \times Cs}{(Ci1+Ci3)(Cl+Cs)+Cl \times Cs},$$

where gm2 is the mutual conductance of the output stage 10-2, and $\chi$ is the coefficient indicative of the rate of change in the threshold voltage of the NMOSTs 31a and 31b constituting the source follower circuit 10-3 to the substrate bias voltage.

As shown in the equation (8), since the operation bandwidth is proportional to the mutual conductance gm2 of the output stage 10-2, it is possible to set the mutual conductance gm2 at a large value to increase the operation bandwidth.

The setting of the mutual conductance gm2 at a large value would result in an increase in the input capacitance Ci2. However, it is also possible to increase the capacitance Cm of the phase compensation capacitors 33a and 33b, thereby compensating for a decrease in the operation bandwidth resulting from the increase in the input capacitance Ci2. On the other hand, an increase in the capacitance Cm causes the zero point determined by the source follower circuit 10-3 and the parameters Cm, Ro1 and Ci2 to move toward the lower frequency also with a simultaneous shift of the first pole of the input stage 10-1 toward the lower frequency, thereby preventing the phase allowance of the wideband amplifier 10A from being reduced.

As described above, the wideband amplifier 10A according to the first embodiment is provided with the source follower circuit 10-3 in parallel to the input stage 10-1 serving as the first amplifier, with the output of the source follower circuit 10-3 connected to the input of the output stage 10-2 serving as the second amplifier via the phase compensation capacitor 33. This prevents the operation bandwidth from being limited by the manufacturing process employed (e.g., the gate length of the transistor), thereby making it possible to provide an increased operation bandwidth.

Second Embodiment

Figure 5:
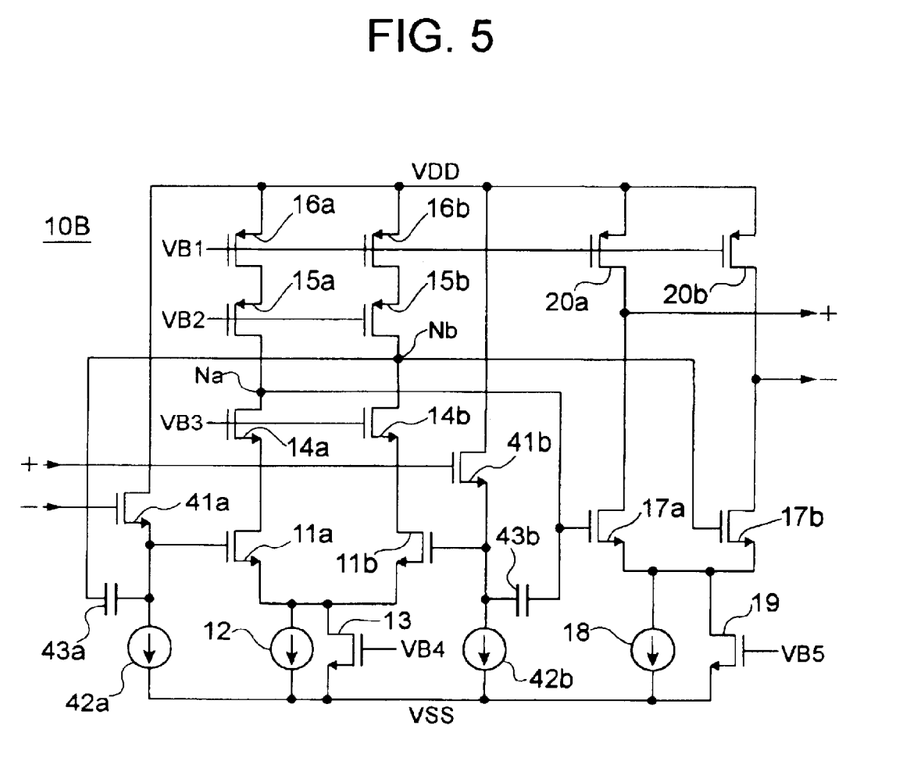
FIG. 5 is a view illustrating the architecture of a wideband amplifier according to a second embodiment of the present invention.

FIG. 5 is a view illustrating the architecture of a wideband amplifier according to a second embodiment of the present invention, in which the same components as those of FIG. 3 are indicated with the same reference symbols.

This wideband amplifier 10B is constructed such that the source follower circuit 10-3 provided in parallel to the input stage 10-1 in the wideband amplifier 10A of FIG. 3 is eliminated, and in place of the source follower circuit 10-3, a source follower circuit 10-4 is provided at the stage in front of the input stage 10-1.

That is, the wideband amplifier 10B includes NMOSTs 41a and 41b and constant-current supplies 42a and 42b, which constitute the source follower circuit 10-4 of differential type, in which the gates of the NMOSTs 41a and 41b serve as the minus input terminal and the plus input terminal of the wideband amplifier 10B, respectively.

The sources of the NMOSTs 41a and 41b are connected to the potential VSS via the constant-current supplies 42a and 42b, respectively, while the drains are directly connected to the potential VDD. The source of the NMOST 41a is connected to the gate of the NMOST 11a as well as to the node Nb via the phase compensation capacitor 43a. Likewise, the source of the NMOST 41b is connected to the gate of the NMOST 11b as well as to the node Na via the phase compensation capacitor 43b. The other components are arranged in the same manner as in FIG. 3 without the NMOSTs 31a and 31b, the constant-current supplies 32a and 32b, and the capacitors 33a and 33b.

Figure 6:
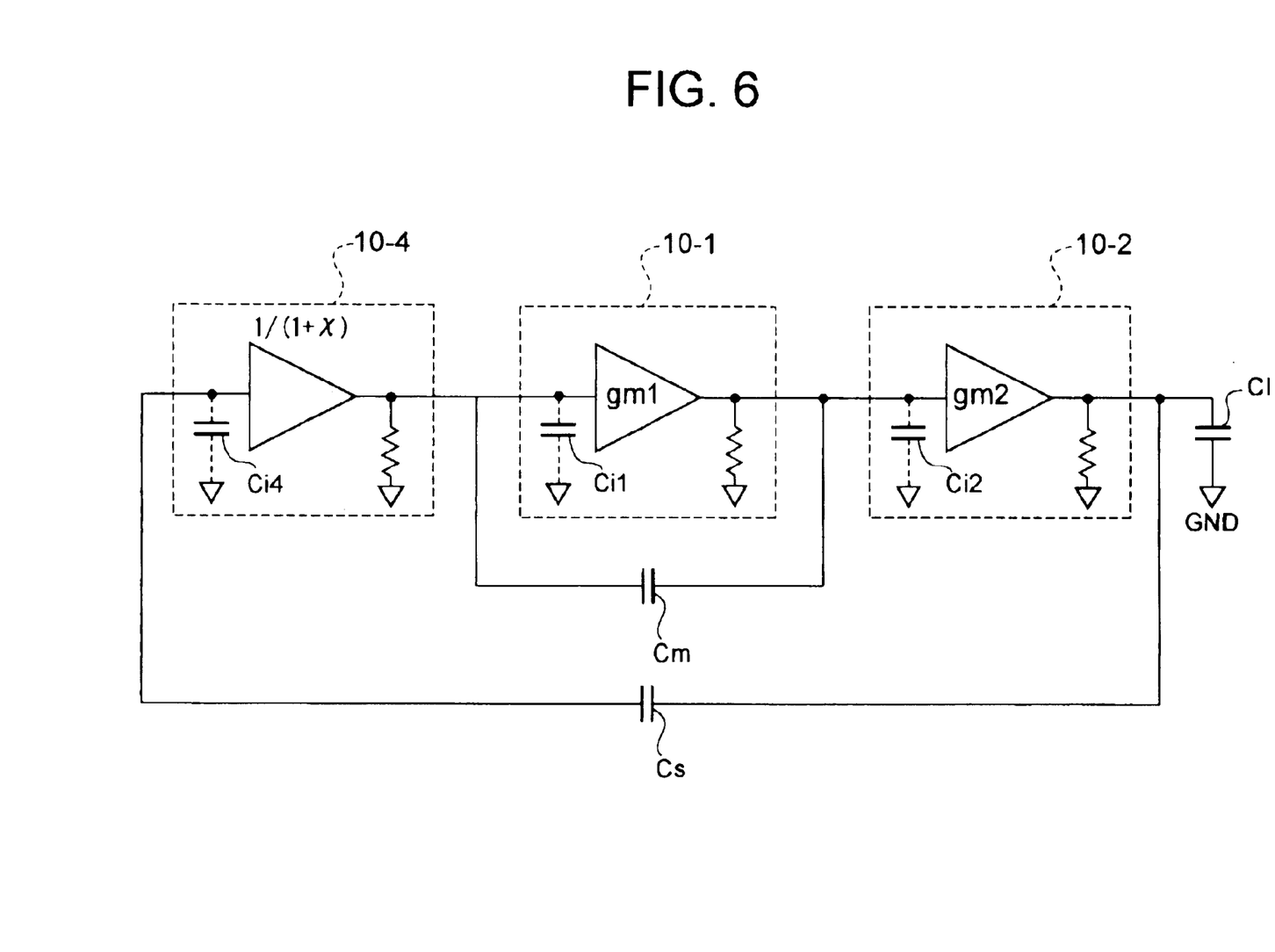
FIG. 6 is a view illustrating an equivalent circuit of the wideband amplifier of FIG. 5 during its hold operation.

FIG. 6 is a view illustrating an equivalent circuit of the wideband amplifier 10B of FIG. 5 serving as a sample and hold circuit, for a small high-frequency signal during its hold operation.

As shown in FIG. 6, during a hold operation, the source follower circuit 10-4, the input stage 10-1, and the output stage 10-2 of the wideband amplifier 10B are connected in series, and the load capacitors CLp and CLm (with capacitance Cl) are connected between the output of the output stage 10-2 and the ground potential GND. Additionally, the output of the output stage 10-2 and the input of the source follower circuit 10-4 are connected to each other via the capacitors CSp and CSm (with capacitance Cs). Furthermore, the input and output of the input stage 10-1 are connected to each other via the phase compensation capacitors 43a and 43b (with capacitance Cm). Input capacitance Ci1 is formed between the ground potential GND and the input of the input stage 10-1, input capacitance Ci2 is formed between the ground potential GND and the output stage 10-2, and input capacitance Ci3 is formed between the ground potential GND and the source follower circuit 10-4.

In the above equivalent circuit, let BWop denote the bandwidth of the wideband amplifier 10B, and let β denote the feedback factor. We assume that the small signal output resistor Ro1 of the input stage 10-1 is sufficiently higher than a small signal output resistor Ro4 of the source follower circuit 10-4, and that the first pole of the input stage 10-1 is lower than the zero point that is determined by the source follower circuit 10-4 and the parameters Cm, Ro1 and Ci2. Then, the closed-loop bandwidth BWcl indicative of an operation bandwidth is expressed as in the following equation (9):

$$BWcl = BWop \times \beta \qquad (9)$$

$$= \left\{ \frac{1}{1+\chi} \times \frac{Cm}{Cm+Ci2} \times \frac{gm2}{Cl + \frac{Cs \times Ci4}{Ci1+Ci4+Cs}} \right\} \times \frac{Cs}{Ci1+Ci4+Cs}$$

$$= \frac{1}{1+\chi} \times \frac{Cm}{Cm+Ci2} \times \frac{gm2 \times Cs}{(Ci1+Ci4)(Cl+Cs)+Cl \times Cs},$$

where gm2 is the mutual conductance of the output stage 10-2, and χ is the coefficient indicative of the rate of change in the threshold voltage of the NMOSTs 41a and 41b constituting the source follower circuit 10-4 to the substrate bias voltage.

As shown in the equation (9), since the operation bandwidth is proportional to the mutual conductance gm2 of the output stage 10-2, it is possible to set the mutual conductance gm2 at a large value to increase the operation bandwidth.

As in the first embodiment, the setting of the mutual conductance gm2 at a large value would result in an increase in the input capacitance Ci2. However, it is possible to increase the phase compensation capacitance Cm, thereby compensating for a decrease in the operation bandwidth resulting from the increase in the input capacitance Ci2. On the other hand, an increase in the capacitance Cm causes the zero point determined by the source follower circuit 10-4 and the parameters Cm, Ro1 and Ci2 to move toward the lower frequency also with a simultaneous shift of the first pole of the input stage 10-1 toward the lower frequency, thereby preventing the phase allowance of the wideband amplifier 10B from being reduced.

On the other hand, in the wideband amplifier 10B, the source potential of the NMOSTs 41a and 41b in the source follower circuit 10-4 is made higher by the amount of the threshold voltage of the NMOSTs 11a and 11b in the input stage relative to the source potential of the NMOSTs 31a and 31b of the source follower circuit 10-3 in the wideband amplifier 10A according to the first embodiment. In the wideband amplifier 10A, the feedback factor β is reduced in accordance with the sum of the input capacitance $C_{i1}$ of the input stage 10-1 and the input capacitance $C_{i3}$ of the source follower circuit 10-3, whereas in the wideband amplifier 10B, the factor is reduced only in accordance with the input capacitance $C_{i4}$ of the source follower circuit 10-4. Accordingly, the wideband amplifier 10B is suitable for process with a small coefficient χ or a high MOS input capacitance.

As described above, the wideband amplifier 10B according to the second embodiment is configured such that the source follower circuit 10-4 is provided at the stage in front of the input stage 10-1 serving as the first amplifier, and the output of the source follower circuit 10-4 is connected to the input of the output stage 10-2 serving as the second amplifier via the phase compensation capacitor 43. This configuration provides the same advantages as those of the first embodiment.

The present invention is not limited to the aforementioned embodiments, but may be modified in a variety of ways. Examples of the modifications are as follows.

Figure 7:
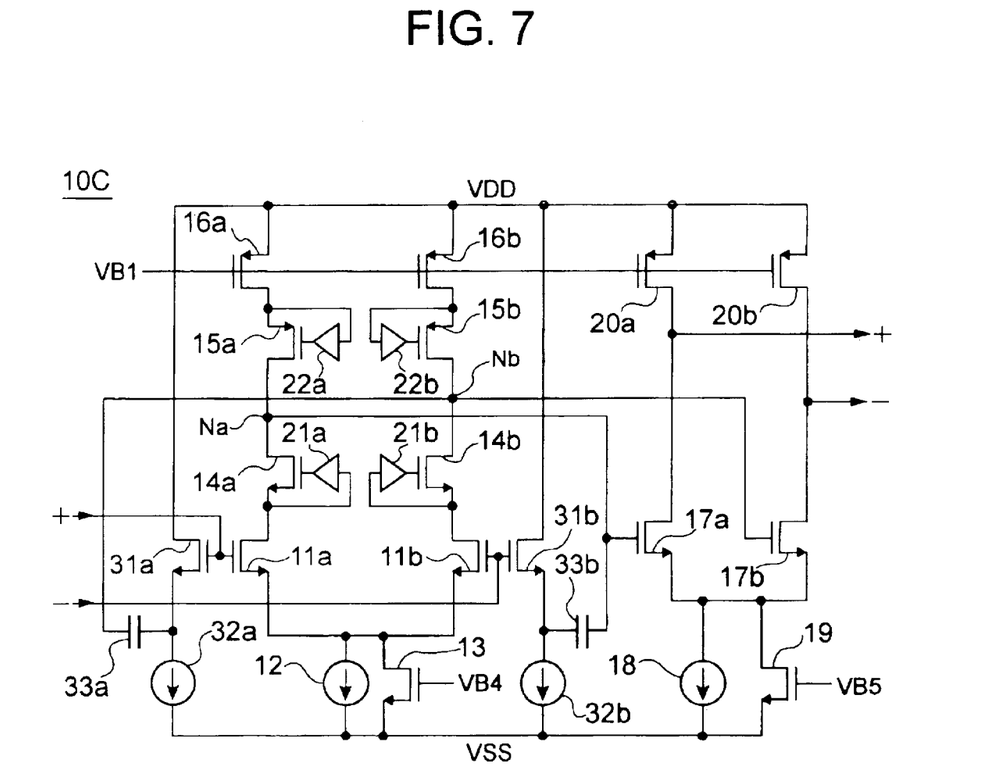
FIG. 7 is a view illustrating the architecture of a wideband amplifier according to another embodiment of the present invention.

(a) FIG. 7 is a view illustrating the architecture of a wideband amplifier according to another embodiment of the present invention. The wideband amplifier 10C is configured to have gain boosted cascode amplifiers in the input stage 10-1 of the wideband amplifier 10A shown in FIG. 3. That is, the gates of the NMOSTs 14a and 14b are provided with, instead of the bias voltage VB3, their respective source voltages that have been amplified at the feedback amplifiers 21a and 21b. The gates of the PMOSTs 15a and 16a are provided with, instead of the bias voltage VB2, their respective source voltages that have been amplified at the feedback amplifiers 22a and 22b. This configuration allows the equivalent circuit in its hold operation to have a significantly increased output resistance Ro1 in the input stage 10-1, causing a frequency separation of the first pole of the input stage 10-1 from the zero point that is determined by the source follower circuit 10-3 the parameters Cm, Ro1 and Ci2. It is thus possible to provide a further increased phase allowance to the wideband amplifier.

(b) The input stage 10-1 of the wideband amplifier 10B shown in FIG. 5 may also have the gain boosted cascode amplifiers as in (a) above, thereby providing the same effects.

(c) The capacitors 33a and 33b of FIGS. 1 and 7 and the capacitors 43a and 43b of FIG. 5 may also be formed of the MOS capacitors that have the capacitance between a common connection of the source and drain of a MOS transistor and its gate. This configuration makes it possible to provide a reduced layout area when compared with a capacitor that is formed of a capacitive element such as a metal fringing capacitor, MIM (Metal-Insulator-Metal) or PIP (Polysilicon-Insulator-Polysilicon).

It is understood that the foregoing description and accompanying drawings set forth the preferred embodiments of the invention at the present time. Various modifications, additions and alternatives will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent application No.2003-181094 which is hereby incorporated by reference.

What is claimed is:

1. A wideband amplifier including a first differential amplifier for providing amplified differential signals at first and second nodes in response to first and second differential input signals; and a second differential amplifier for amplifying said amplified differential signals to provide differential output signals, which comprises:

first and second phase compensation capacitors;

a first source follower circuit including a first MOS transistor receiving said first differential input signal at a gate thereof and having the sources thereof connected to a first constant-current supply and to said second node via said first phase compensation capacitor; and a second source follower circuit including a second MOS transistor receiving said second differential input signal at a gate thereof and having the source thereof connected to a second constant-current supply and to said first node via said second phase compensation capacitor.

2. A wideband amplifier according to claim 1, wherein said first differential amplifier directly receives said first and second differential input signals.

3. A wideband amplifier according to claim 2, wherein said first differential amplifier said first and second differential input signals through said first and second source follower circuits.

4. A wideband amplifier according to claim 1, wherein said first differential amplifier includes a gain boosted cascode amplifier.

5. A wideband amplifier according to claim 1, wherein said first and second phase compensation capacitors include MOS capacitors.

6. A wideband amplifier comprising:

a first source follower circuit including a first MOS transistor receiving a first differential input signal at a gate thereof and having the source thereof connected to a first constant-current supply;

a second source follower circuit including a second MOS transistor receiving a second differential input signal at a gate thereof and having the source thereof connected to a second constant-current supply;

a first differential amplifier for amplifying signals supplied from sources of said first and second MOS transistors to provide first and second amplified differential signals at first and second nodes;

a first phase compensation capacitor connected between a source of said first MOS transistor and said second node;

a second phase compensation capacitor connected between a source of said second MOS transistor and said first node; and a second differential amplifier for amplifying said first and second amplified differential signals to provide differential output signals.

* * * * *